US010763100B2

(12) United States Patent
Mitsunaga

(10) Patent No.: US 10,763,100 B2
(45) Date of Patent: Sep. 1, 2020

(54) METHOD FOR MANUFACTURING RESTORED SUBSTRATE AND METHOD FOR MANUFACTURING LIGHT EMITTING ELEMENT

(71) Applicant: NICHIA CORPORATION, Anan-shi, Tokushima (JP)

(72) Inventor: Takayuki Mitsunaga, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 211 days.

(21) Appl. No.: 15/845,050

(22) Filed: Dec. 18, 2017

(65) Prior Publication Data

US 2018/0182617 A1 Jun. 28, 2018

(30) Foreign Application Priority Data

Dec. 22, 2016 (JP) ................. 2016-248994

(51) Int. Cl.
| | |
|---|---|
| *H01L 21/02* | (2006.01) |
| *B08B 3/08* | (2006.01) |
| *H01L 33/00* | (2010.01) |
| *H01S 5/02* | (2006.01) |
| *B08B 3/12* | (2006.01) |

(Continued)

(52) U.S. Cl.
CPC .......... *H01L 21/02079* (2013.01); *B08B 3/08* (2013.01); *B08B 3/12* (2013.01); *H01L 33/007* (2013.01); *H01S 5/0213* (2013.01); *B08B 3/04* (2013.01); *H01L 21/0242* (2013.01); *H01L 21/0254* (2013.01); *H01L 21/02658* (2013.01);
(Continued)

(58) Field of Classification Search
CPC . H01L 21/02079; H01L 33/007; H01L 33/22; H01L 21/02658; H01L 21/0254; H01L 21/0242; H01L 21/02661; B08B 3/12; B08B 3/08; B08B 3/04; H01S 5/0213
See application file for complete search history.

(56) References Cited

U.S. PATENT DOCUMENTS 5,389,571 A * 2/1995 Takeuchi .......... H01L 21/02381
117/89
6,335,218 B1 * 1/2002 Ota ...................... H01L 33/007
438/46

(Continued)

FOREIGN PATENT DOCUMENTS

| JP | 2002314123 A | 10/2002 |
|---|---|---|
| JP | 2009010310 A | 1/2009 |

(Continued)

*Primary Examiner* — Stephen W Smoot
*Assistant Examiner* — Vicki B. Booker
(74) *Attorney, Agent, or Firm* — Global IP Counselors, LLP

(57) ABSTRACT

A method for manufacturing a restored substrate includes: removing a nitride semiconductor layer from a stacked-layer in which the nitride semiconductor layer has been laminated on a substrate; oxidizing material adhering to the substrate to produce an oxide deposit after the removing of the nitride semiconductor layer from the stacked-layer; and removing the oxide deposit from the substrate. A method for manufacturing a light emitting element includes stacking nitride semiconductor layers including an active layer on the restored substrate obtained by the above method.

9 Claims, 4 Drawing Sheets

(51) Int. Cl.
 *B08B 3/04* (2006.01)
 *H01L 33/22* (2010.01)

(52) U.S. Cl.
 CPC ........ *H01L 21/02661* (2013.01); *H01L 33/22* (2013.01)

(56) References Cited

U.S. PATENT DOCUMENTS

| | | | | |
|---|---|---|---|---|
| 7,235,492 | B2* | 6/2007 | Samoilov | B08B 7/0035 134/1.1 |
| 7,699,997 | B2* | 4/2010 | Suzuki | H01L 21/02032 216/55 |
| 2001/0038656 | A1* | 11/2001 | Takeuchi | H01S 5/20 372/45.01 |
| 2003/0057444 | A1* | 3/2003 | Niki | H01L 33/007 257/200 |
| 2010/0330777 | A1* | 12/2010 | Hanaoka | H01L 21/02032 438/458 |
| 2011/0223749 | A1 | 9/2011 | Shiomi et al. | |
| 2014/0138702 | A1* | 5/2014 | Choi | H01L 21/02032 257/76 |
| 2014/0273400 | A1* | 9/2014 | Ishizuka | H01L 21/76254 438/458 |
| 2014/0335683 | A1* | 11/2014 | Lin | H01L 21/0254 438/492 |
| 2015/0221824 | A1* | 8/2015 | Hatta | H01L 21/0237 257/98 |

FOREIGN PATENT DOCUMENTS

| | | |
|---|---|---|
| JP | 2011066392 A | 3/2011 |
| JP | 2011-079728 A | 4/2011 |
| JP | 2014-045097 A | 3/2014 |
| JP | 2014-103397 A | 6/2014 |
| JP | 2016-056057 A | 4/2016 |

* cited by examiner

METHOD FOR MANUFACTURING RESTORED SUBSTRATE AND METHOD FOR MANUFACTURING LIGHT EMITTING ELEMENT

CROSS-REFERENCE TO RELATED PATENT APPLICATION

The present application claims priority under 35 U.S.C. § 119 to Japanese Patent Application No. 2016-248994, filed Dec. 22, 2016. The contents of this application are incorporated herein by reference in their entirety.

Technical Field

The present disclosure relates to a method for manufacturing a restored substrate and a method for manufacturing a light emitting element.

Background Art

There are conventional light emitting elements that make use of a stacked-semiconductor wafer in which a nitride semiconductor layer is stacked on a substrate, such as a light emitting diode or a laser element.

Also, with a stacked semiconductor wafer, after a nitride semiconductor layer has been formed on a substrate, problems sometimes occur that require the nitride semiconductor layer to be stripped and the substrate restored (For example, JP2014-045097A).

SUMMARY

In the case where a nitride semiconductor layer is stripped and the substrate is to be reused, if there is any damage to the substrate or if any residue remains on the substrate after stripping, so that there is an abnormality on the substrate surface, then a good stacked-semiconductor layer cannot be obtained at the nitride semiconductor layers when the nitride semiconductor layers are restacked, and there may be a decrease in the yield or characteristics of the obtained light emitting elements. Therefore, there is a need for a method for restoring a substrate to good quality with which such problems are less likely to occur.

It is, therefore, one aim of certain embodiments is to provide a method for manufacturing a restored substrate with which a substrate can be restored to a high quality, and a light emitting element that makes use of this method.

The embodiments include the aspects described below.

According to one aspect of the invention, a method for manufacturing a restored substrate includes: removing a nitride semiconductor layer from a stacked-layer in which the nitride semiconductor layer has been laminated on a substrate; oxidizing material adhering to the substrate to produce an oxide deposit after the removing of the nitride semiconductor layer from the stacked-layer; and removing the oxide deposit from the substrate.

According to another aspect of the invention, a method for manufacturing a light emitting element includes stacking nitride semiconductor layers including an active layer on the restored substrate obtained by the above method.

According to certain embodiments of the present invention, it is possible for the substrate to restore to a high quality.

DETAILED DESCRIPTION

Figure 1A:
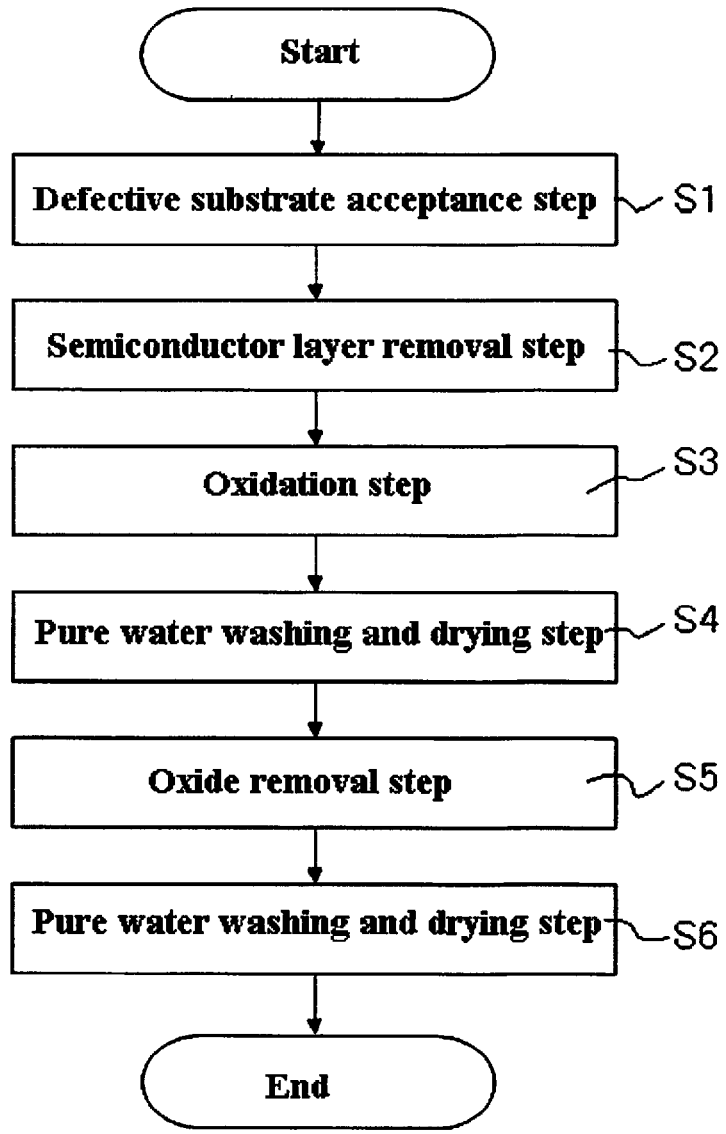
FIG. 1A is a flowchart showing the flow of the method for manufacturing a restored substrate in an embodiment of the present invention.

The embodiments shown below are intended as illustrative to give a concrete form to technical ideas of the present invention, and the scope of the invention is not limited to those described below. The sizes and the positional relationships of the members in each of the drawings are occasionally shown exaggerated for ease of explanation. Further, in the description below, the same designations or the same reference numerals denote the same or like members and duplicative descriptions will be appropriately omitted.

The method for manufacturing a restored substrate in this embodiment includes removing a nitride semiconductor layer from a stacked-layer in which this nitride semiconductor layer has been stacked on a substrate (S2 in FIG. 1A), oxidizing any material adhering to the substrate to produce an oxide deposit (S3 in FIG. 1A), and removing the oxide deposit from the substrate (S5 in FIG. 1A), in that order.

This method reduces damage to the substrate, stripping residue, adhesion of foreign matter, and the like. Also, since the substrate can be restored to a high level of quality, the characteristics of the obtained light emitting element can be improved when the restored substrate is reused.

Removal of Nitride Semiconductor Layer: S2

Figure 2A:
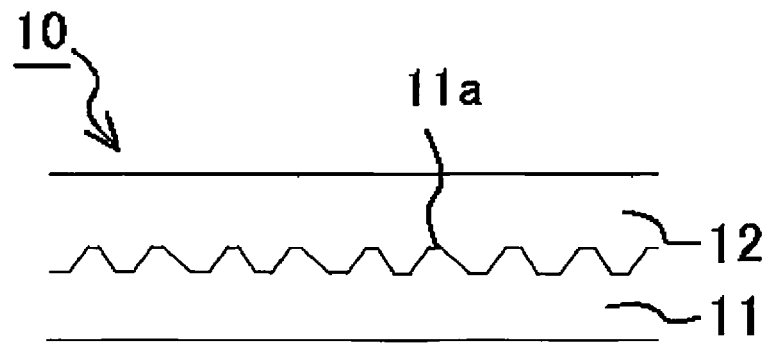
FIG. 2A is a schematic cross-sectional view of a stacked-layer used in the method for manufacturing a restored substrate.
Figure 2B:
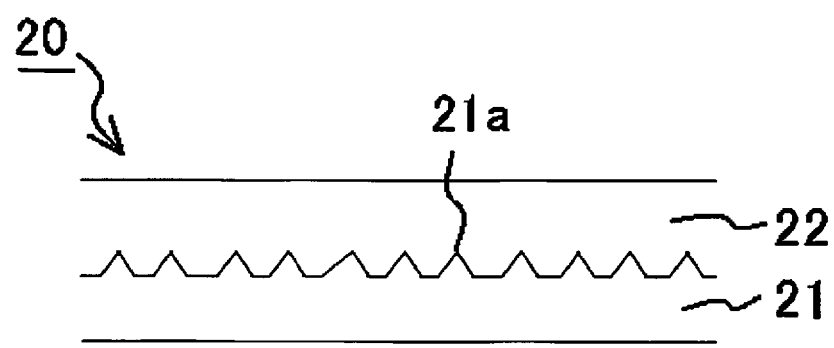
FIG. 2B is a schematic cross-sectional view of another stacked-layer used in the method for manufacturing a restored substrate.
Figure 2C:
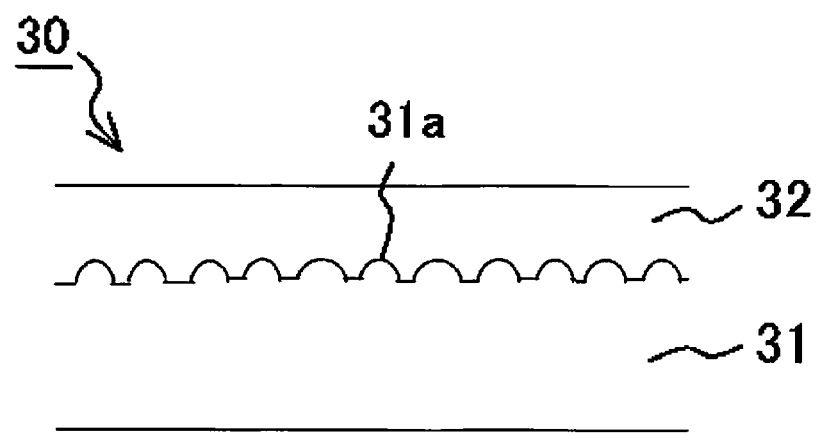
FIG. 2C is a schematic cross-sectional view of still another stacked-layer used in the method for manufacturing a restored substrate.

With the method for manufacturing a restored substrate in this embodiment, a nitride semiconductor layer 12, 22, or 32 formed on a substrate (wafer) 11, 21, or 31 is removed from the staked semiconductor wafer (stacked semiconductor substrate) 10, 20, or 30 shown in FIGS. 2A to 2C. The restoration of the substrate in this embodiment may be performed on any stacked semiconductor wafer, but is performed, for example, on a wafer that would be difficult to use as a material of a light emitting element due to poor characteristics, in which there is adhesion of foreign matter, etc.

An example of the nitride semiconductor layer 12, 22, or 32 is a single layer of a nitride semiconductor layer expressed by the general formula $In_xAl_yGa_{1-x-y}N$ ($0 \le x$, $0 \le y$, $x+y \le 1$), for example, or a stacked-layer structure including this layer. The total thickness of the nitride semiconductor layer is usually one that will allow function as a light emitting element. In the case of a stacked-layer structure, the composition (the type and amount of the constituent elements) of each semiconductor layer may be different, and the stacked-layer structure need not be made up entirely of nitride semiconductor layers. For example, it may include GaP, GaAs, or other such Group III to V compound semiconductors, ZnSe, Group II to VI compound semiconductors, or other such layers.

The substrate 11, 21 or 31 may be any one that will allow epitaxial growth of a nitride semiconductor layer, examples of which include sapphire ($Al_2O_3$) and the like. It is particularly preferably to use a substrate whose main plane is the C plane, the A plane, the R plane, or the M plane, and it is more preferably to use a substrate having the A plane or the C plane as the orientation flat plane, and still more preferably to use a sapphire substrate. In particular, a sapphire substrate having the C plane (0001) as its main plane and the A plane (11-20) as an orientation flat plane is preferable.

It is preferable for the substrate to have no unevenness on the face where the nitride semiconductor is provided, that is, to be flat. This affords better characteristics and yield of the light emitting element manufactured using the restored substrate.

The substrate 11, 21, or 31 may have protrusions on a surface on which the nitride semiconductor layer is provided, for the purpose of enhancing the light takeoff efficiency of the light emitting element to be manufactured, for example. An example of a substrate having such surface with protrusions is the substrate described in Japanese Patent No. 5,267,462.

For instance, with a substrate having protrusions, the size and shape of the protrusions 11a, 21a, or 31a can be appropriately selected. For example, the planar shape of each of the protrusions as seen from the side of the substrate, on which the semiconductor layers are stacked, may be polygonal, and particularly triangular hexagonal, or may be circular, etc.

In the case that the size of the planar shape (bottom surface shape) of the protrusions, that is, the planar shape of the protrusions, is polygonal, it is preferable for the length of one of the sides constituting the protrusion to be at least $\lambda/4$ ($\lambda$ is the emission wavelength, and n is the refractive index of the semiconductor layer). More specifically, one side of the lower part of the protrusion may be about 0.1 to 5 μm, about 1 to 4 μm, about 2 to 3.5 μm, or about 2.6 to 3.2 μm. The spacing between the protrusions is at least $\lambda/4$, and is preferably about 100 μm or less, and more preferably about 20 μm or less. The spacing here indicates the minimum distance between adjacent protrusions at the substrate surface (the bottom faces of the protrusions).

Examples of the vertical cross sectional shape of the protrusions 11a, 21a and 31a include a substantially trapezoidal shape (FIG. 2A), a substantially triangular shape (FIG. 2B), a substantially quadrangular shape, and a substantially semicircular shape (FIG. 2C). The taper angle in the case where the vertical cross sectional shape of the protrusions is substantially trapezoidal, substantially triangular, or the like refers to the angle formed by the bottom face and the side faces of the protrusions on the substrate, and examples include 90° or less, 75° or less, and 65° or less, and 20° or more, 30° or more, and 40° or more. This is to ensure an improvement in efficiency of scattering or diffraction and to prevent the occurrence of pitting in the semiconductor layer.

From the viewpoint of restoring a good substrate, it is preferable for the surface area of the upper faces of the protrusions to be small. It is preferable for the protrusions not to have an upper face and to have a cross sectional shape that is substantially triangular. In the case that the upper faces of the protrusions are circular, for example, it is preferable for the diameter to be 0.5 μm or less.

The height of the protrusions is, for example, 0.1 μm or more, and is equal to or less than the total thickness of the semiconductor layers stacked on the substrate. More specifically, it is preferably from 0.5 to 10 μm, and more preferably from 0.8 to 1.7 μm. Also, in the case the emission wavelength is $\lambda$, the height is preferably at least $\lambda/4$.

This is to sufficiently scatter or diffract light, maintain a good flow of electrical current in the lateral direction of the stacked-semiconductor layers, and ensure light good emission efficiency.

These protrusions can be formed by a method known in the art, such as a method in which a mask pattern of an appropriate shape is used to perform etching, such as dry etching or wet etching (discussed below). Wet etching is particularly preferably. Examples of the etchant in this case include a mixture of sulfuric acid and phosphoric acid, and KOH, NaOH, phosphoric acid, and potassium pyrosulfate.

The substrate may have an off angle on its surface. The off angle is preferably no more than 10 degrees, for example, and more preferably no more than 5 degrees.

The thickness of the substrate may be, for example, about 100 to 300 μm.

Examples of a method for removing the nitride semiconductor layer from the substrate include etching, blasting, polishing, and other methods known in the art. Of these, the use of etching is preferable. The etching may be a combination of dry etching and wet etching, but it is preferable to remove the layer by dry etching. The etchant may be any one that can remove the nitride semiconductor layer. For example, for dry etching, chlorine (Cl2) gas can be used. For wet etching, aqueous hydrogen peroxide can be used. Dry etching is preferable in that there is no need to control the concentration of the etching solution and waste liquid treatment is unnecessary.

In dry etching, chlorine gas and a carrier gas (such as nitrogen gas) are preferably used in a volume of 1:0.5 to 1:2, for example, and more preferably used in a volumetric ratio of 1:1 to 1:1.5.

The ambient temperature of the dry etching is preferably 700° C. or lower, more preferably 670° C. or lower, and still more preferably 660° C. or lower. Also, 600° C. or higher is preferable, and 625° C. or higher is more preferable. In particular, temperature range of 600 to 800° C. is preferable, a temperature range of 625 to 670° C. is more preferable, and a temperature range of 650±5° C. is still more preferable. In the case where the dry etching is performed under such conditions of gas and temperature range, this will reduce damage to the substrate, and the nitride semiconductor layer can also be removed by dry etching alone.

The amount in which the chlorine gas is introduced can be appropriately selected according to the volume of the chamber and the volume of the semiconductor layer to be removed, but an example is 1000 to 20,000 sccm, and 2000 to 10,000 sccm is preferable.

The duration of the dry etching can be appropriately adjusted depending on the amount of chlorine gas introduced, the ambient temperature, and so forth, but can be from 20 minutes to 3 hours, for example.

The dry etching may be divided up and performed a number of times, replacing the chlorine gas that is introduced, in order to improve the reaction efficiency between the nitride semiconductor layer and chlorine gas, to stabilize the reaction by decreasing the volume of the chamber into which the gas is introduced, or for another such reason. In the case that dry etching is thus performed a number of times, the total duration of etching a plurality of times can be from 20 minutes to 3 hours.

As another method for removing the nitride semiconductor layer, in the case where aqueous hydrogen peroxide is used in wet etching, a solution having a concentration of 25 to 35 wt % can be used at a temperature of about 20±10° C., for example. The wet etching duration is from 1 minute to 3 hours, for example.

In this embodiment, in the case that a metal layer such as an electrode or the like has been formed on the nitride semiconductor layer before the nitride semiconductor layer is removed from the substrate, this metal layer or the like is preferably removed in advance. This is because the removal method and/or removal etchant for the metal layer differs from that of the nitride semiconductor layer.

Various methods can be employed for removal of the metal layer, such as wet etching, dry etching, dry or wet blasting, laser irradiation, or polishing. Of these, wet etching or blasting is preferable from the standpoint of preventing redeposition of the metal material and damage to the substrate. The conditions of wet etching, the type of etchant, the abrasive used for blasting, and so forth can be appropriately adjusted according to the metal material being used.

It is preferable to wash the nitride semiconductor layer after it is removed from the substrate, before oxidization of the deposits. Washing can be performed with water, such as tap water, ion exchange water, or pure water. This allows the removal of any water-soluble residue (such as GaCl in the case where chlorine gas is used to remove the nitride semiconductor layer) remaining on the substrate. The temperature during this washing may be about 0 to 80° C., for example, but about 20° C.±10° C. is preferable. It is also preferable to wash the layer under ultrasonic waves. The washing may involve, for example, exposure to running water for several minutes to several tens of minutes, or immersion in a water bath for several minutes to several tens of minutes. In the case of ultrasonic cleaning, the frequency may be from several tens of kHz to several thousands of kHz, for example, and ultrasonic waves of 100±20 kHz are preferably applied.

Drying may be performed after washing. Various methods can be used, such as heat drying, forced air drying, natural drying, and the like. The temperature and time can be appropriately adjusted.

Oxidation of Deposits: S3

After the step of removing the nitride semiconductor layer, deposits adhering to the substrate are oxidized to form oxidized deposits. Deposits include not only deposits attributable to the nitride semiconductor layer, but also any dopant contained therein, those derived from impurities attributable to the apparatus used in removing the nitride semiconductor layer, and the like. In particular, this embodiment can be preferably applied in the case that elemental silicon is included as a deposit. It is difficult to remove elemental silicon, and its removal requires the use of a solution that will damage the substrate.

The oxidation of the deposits may be carried out to the extent that the deposits can be removed in the washing/removal step (the subsequent step), but it is preferable to oxidize not only the surface but also the interior of the deposits, so that the entire deposit is oxidized.

The oxidation in this case can be performed by various methods, such as holding in an oxygen-containing gas atmosphere, heating under an oxygen-containing gas atmosphere, and immersion in an oxidizing solution. Of these, holding in an oxygen-containing gas atmosphere is preferred from the viewpoint of preventing damage to the substrate. Holding under an oxygen-containing gas atmosphere is performed, for example, under a normal atmosphere (in the air). Oxidation can be easily carried out by holding the layer under a normal atmosphere.

The temperature can be appropriately selected from the range over which oxidation of the deposits occurs. From the standpoint of being able to perform oxidation easily, it is preferable to perform it at normal temperature, such as within a temperature range of about 20±10° C. The oxidation duration is, for example, from several days to one year in the case of storage in the air at normal temperature, with several days to half a year being preferable, 5 days to 1 month more preferable, and 6 to 10 days still more preferable.

Holding the layer in this way affords easy oxidation of substantially all of the deposits that are difficult to remove in a state in which the nitride semiconductor layer adhering to the substrate has been removed, and this allows the deposits to be easily removed in a later step.

After the deposits have been oxidized, the above-mentioned washing and drying (S4 in FIG. 1A) may be further carried out.

Removal of Oxidized Deposits: S5

Removal of oxidized deposits from the substrate can be achieved by a method such as etching, blasting, or polishing. Of these, etching is preferable. Etching may be performed by a combination of dry etching and wet etching, but it is preferable to remove the deposits by wet etching alone. Any etchant may be used as long as it can remove oxidation deposits. For example, in the case where the substrate is sapphire and the oxide deposits are mainly SiO2, a hydrofluoric acid-containing solution such as buffered hydrofluoric acid may be used. Using these substances makes it easy to remove the oxidation deposits which are SiO2 obtained the oxidization of silicon deposits, while reducing damage to the substrate. The concentration of hydrofluoric acid here is 3 to 30 wt %, for example. The temperature of the etchant in wet etching is about 10 to 80° C., for example, but it is preferably around room temperature ±10° C. The wet etching duration is, for example, from several seconds to several tens of minutes, preferably from 1 to 20 minutes, more preferably from 1 to 15 minutes, and even more preferably from 1 to 3 minutes. In order to improve the reaction efficiency between the oxidation deposits and the etchant, removal of the oxidized deposits may be performed a plurality of times with the etchant replaced each time. Buffered hydrofluoric acid is preferable because it is safer and easier to handle than hydrofluoric acid.

It is preferable to further perform the above-mentioned washing and drying (S6 in FIG. 1A) after removal of the oxidation deposits from the substrate.

Formation of Nitride Semiconductor Layer on Restored Substrate

A substrate from which a nitride semiconductor layer has been removed by the above method is similar to an ordinary semiconductor growth substrate in that it can be used as a substrate for forming a light emitting element or the like by epitaxially growing another nitride semiconductor and a staked-nitride semiconductor layer that includes an active layer.

In particular, in the case that a light emitting element is produced using a substrate that has been restored by the above method, it has been confirmed that the characteristics of the light emitting element thus obtained can sometimes be made equivalent to those of an ordinary substrate that has not been restored.

The method for manufacturing a restored substrate of the present application will now be described in detail on the basis of Examples.

Example 1

Twenty five sapphire wafers 6 with a diameter of 4 inches were prepared (S1 in FIG. 1A). An epitaxial growth layer in which the nitride semiconductor layer had a total thickness of about 10 to 12 µm was stacked on each sapphire wafer 6, and the products were used as substrates with defective characteristics.

The sapphire substrates were each a substrate having a C plane (0001) as its main plane and an A plane (11-20) as an orientation flat plane, and had protrusions on the approximate whole surface on which the nitride semiconductor layer was provided. The shape of the protrusions was such that the planar shape seen from the upper face of the protrusion was an approximate equilateral triangle, and the length of one of the sides constituting the protrusion was about 3.3 µm. The vertical cross sectional shape of the protrusions was substantially trapezoidal, and the angle formed by the bottom face and the side faces of each protrusion was, for example, 56°. The shape of the upper face of the protrusions was an approximate equilateral triangle, and the length of a perpendicular drawn from one vertex of the triangle to one side was about 0.5 µm. The height of the protrusions was about 1.1 to 1.7 µm. The spacing between the centers of the upper faces of two adjacent protrusions was about 3.0 µm.

Figure 3:
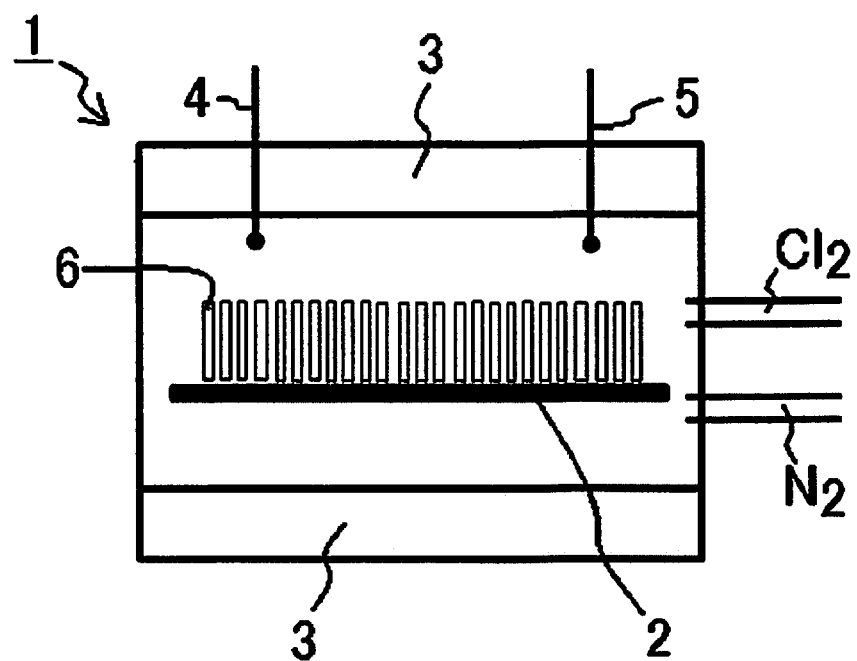
FIG. 3 is a schematic diagram of a processing apparatus, illustrating the step of removing a nitride semiconductor layer from a stacked-layer.

In order to remove the nitride semiconductor layer from the sapphire wafer 6 (S2 in FIG. 1A), the wafer was introduced into the dry etching apparatus 1 shown in FIG. 3 and placed on a substrate holder 2.

Figure 1B:
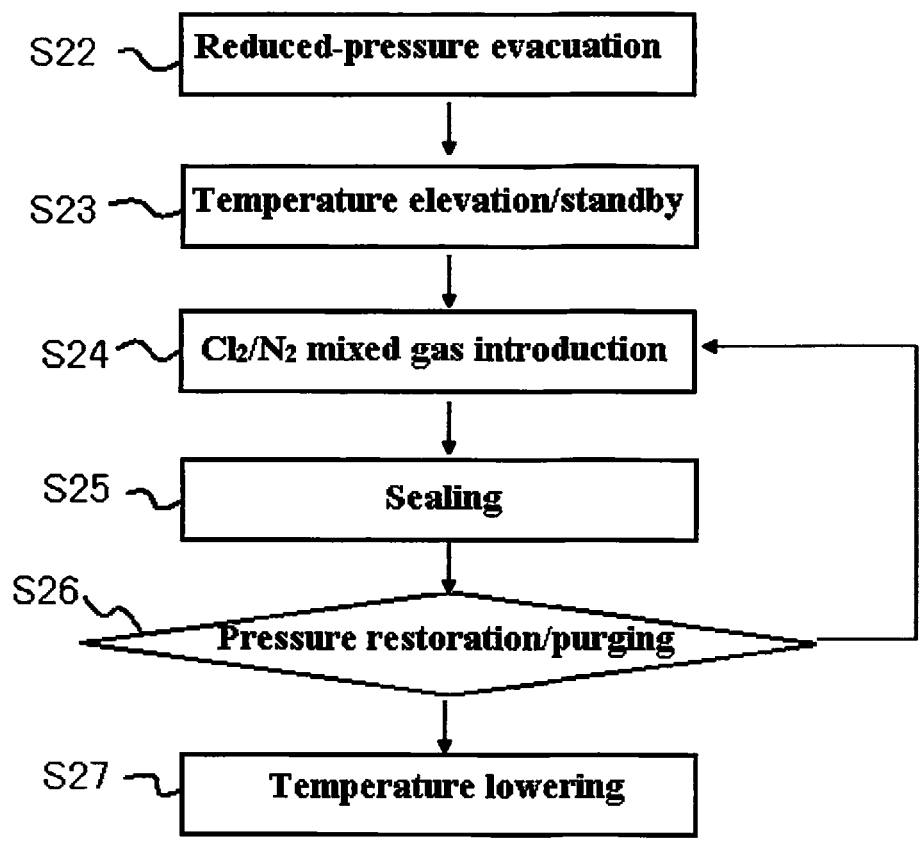
FIG. 1B is a flowchart showing the flow of the step of removing a semiconductor.

After this, as shown in FIG. 1B, the inside of the chamber was evacuated under reduced pressure (S22), and the temperature inside the chamber was set at 650 degrees. The error of this temperature is about ±5° C. from the set value (S23).

The dry etching apparatus 1 is configured such that SiO2 is included in part of the device (specifically, the furnace core tube for accommodating wafers) within the chamber, which is surrounded by a heater 3. Also, a thermometer 4 and a pressure gauge 5 for monitoring the ambient temperature and pressure, respectively, are provided in the chamber. Furthermore, a gas introduction port is provided to the chamber, and chlorine gas and nitrogen gas can be introduced from this gas introduction port while their flow rates are controlled.

For example, chlorine gas and nitrogen gas were introduced into the chamber from the gas inlet port in a ratio of 1:1.5, that is, at 2000 sccm and 3000 sccm, for 1 minute (S24). After the gas was introduced, a series of steps of reacting the sapphire wafer 6 with the introduced gas for 20 minutes (S25) and evacuating (S26) was repeated three times to allow the nitride semiconductor layer and the chlorine gas to react three times, and a total of approximately 10 to 12 µm of the nitride semiconductor layer was removed. After this, the inside of the chamber was cooled (S27).

The wafer thus obtained was washed with pure water for 5 minutes to remove the water-soluble residue remaining on the substrate.

The washed wafer was kept at normal temperature in the air for a period of from six days to four months to oxidize the deposits, thus forming oxidized deposits (S3 in FIG. 1A).

Next, the wafer was subjected to ultrasonic cleaning in pure water for 7 minutes, and then the wafer was dried (S4 in FIG. 1A). The ultrasonic cleaning here was performed at 100 kHz.

The resulting wafer was then immersed for 2 minutes in a liquid containing 15.7 wt % buffered hydrofluoric acid to remove the oxidized deposits including SiO2 (S5 in FIG. 1A).

After this, the substrate was washed with pure water and dried (S6 in FIG. 1A) to obtain a sapphire wafer.

A nitride semiconductor layer were epitaxially grown and stacked on restored sapphire wafers through this series of steps, the nitride semiconductor layer with good crystallinity could be obtained regardless of how long (between six days and four months) it had been held at normal temperature and in the air, and regardless of the kind of the etchant used in wet etching or the length of time mentioned above. Also, in the case where a light emitting element was formed using a restored substrate equipped with this nitride semiconductor layer, it was confirmed that a light emitting element can be obtained that has characteristics within a variance range as compared to a light emitting element made with an ordinary sapphire wafer, i.e., not restored sapphire substrate.

That is, it was confirmed that the above series of steps reduces damage to the sapphire substrate while allowing a wafer of the restored substrate to be easily and simply obtained.

Example 2

A wafer was restored by the same method as in Example 1, except that 10 wt % hydrofluoric acid was used instead of 15.7 wt % buffered hydrofluoric acid, and the etching time was changed to 1 to 3 minutes.

A good restored substrate could be obtained in this Example 2.

Comparative Example 1

A restored substrate manufactured in the same manner as in Example 1 except that the step of oxidizing the deposits was not performed shall be referred to as Comparative Example 1. A nitride semiconductor layer was again grown on the obtained wafer, but the crystallinity of the nitride semiconductor layer was poor, and nitride semiconductor layers could not be obtained in a high enough yield to be utilized in the manufacture of light emitting elements.

What is claimed is:

1. A method for manufacturing a restored substrate, comprising:
    providing a stacked-layer in which a nitride semiconductor layer containing silicon has been stacked on a surface of a sapphire substrate;
    removing the nitride semiconductor layer from the stacked-layer;
    after the removing of the nitride semiconductor layer from the stacked-layer, a surface of the substrate is exposed;
    forming an oxide deposit containing SiO$_2$ by oxidizing a silicon containing-material adhering to the exposed surface of the substrate, the silicon containing-material being caused by the nitride semiconductor layer; and
    removing the oxide deposit from the substrate to expose the surface of the substrate.

2. The method according to claim 1, wherein
    the removing of the nitride semiconductor layer includes removing the nitride semiconductor layer by using chlorine gas.

3. The method according to claim 2, wherein
    the removing of the nitride semiconductor layer includes removing the nitride semiconductor at a temperature of 600 to 800° C.

4. The method according to claim 1, wherein
    the oxidizing of the material adhering to the substrate includes oxidizing the material adhering to the substrate by using air.

5. The method according to claim 1, wherein
the removing of the oxide deposit from the substrate
includes removing the oxide deposit from the substrate by using a hydrofluoric acid-containing solution.

6. The method according to claim 1, further comprising washing the substrate by pure water after the removing of the nitride semiconductor layer from the stacked-layer and before the oxidizing of the material adhering to the substrate.

7. The method according to claim 1, further comprising washing the substrate by pure water after removing the oxide deposit from the substrate.

8. The method according to claim 1, wherein
the substrate has protrusions on the surface on which the nitride semiconductor layer is provided.

9. A method for manufacturing a light emitting element, comprising
stacking nitride semiconductor layers including an active layer on the restored substrate obtained by the method according to claim 1.

* * * * *